(12) United States Patent
Lei

(10) Patent No.: US 11,152,658 B2
(45) Date of Patent: Oct. 19, 2021

(54) MOBILE TERMINAL PROTECTION ASSEMBLY, MOBILE TERMINAL PROTECTION FRAME, AND BATTERY CASE

(71) Applicant: SHENZHEN ROMOSS TECHNOLOGY CO., LTD, Nanshan (CN)

(72) Inventor: Canhuo Lei, Shenzhen (CN)

(73) Assignee: SHENZHEN ROMOSS TECHNOLOGY CO., LTD, Shenzhen (CN)

( * ) Notice: Subject to any disclaimer, the term of this patent is extended or adjusted under 35 U.S.C. 154(b) by 38 days.

(21) Appl. No.: 16/489,252

(22) PCT Filed: Mar. 1, 2017

(86) PCT No.: PCT/CN2017/075345
§ 371 (c)(1),
(2) Date: Aug. 27, 2019

(87) PCT Pub. No.: WO2018/152859
PCT Pub. Date: Aug. 30, 2018

(65) Prior Publication Data
US 2020/0006717 A1 Jan. 2, 2020

(30) Foreign Application Priority Data

Feb. 27, 2017 (CN) .......................... 201710109624.0

(51) Int. Cl.
*H01M 50/10* (2021.01)
*H04M 1/04* (2006.01)
(Continued)

(52) U.S. Cl.
CPC .............. *H01M 50/10* (2021.01); *H04M 1/04* (2013.01); *H04M 1/21* (2013.01);
(Continued)

(58) Field of Classification Search
CPC ............. H01M 50/10; H01M 2220/30; H01M 50/209; H04M 1/72409; H04M 1/04;
(Continued)

(56) References Cited

U.S. PATENT DOCUMENTS 7,180,754 B2 * 2/2007 Qin ..................... H01M 2/1066
361/755
8,256,612 B1 * 9/2012 Wang ................... H04B 1/3888
206/320
(Continued)

FOREIGN PATENT DOCUMENTS

CN 102856608 1/2013
CN 203424509 2/2014
(Continued)

OTHER PUBLICATIONS

Xue Zhiqi, CN-204376978 Translation, Jun. 2015 (Year: 2015).*
(Continued)

*Primary Examiner* — Diane D Mizrahi
(74) *Attorney, Agent, or Firm* — Workman Nydegger

(57) ABSTRACT

A mobile terminal protection frame (100), comprising a frame body (120), a first snap-in part (140), a second snap-in part, and a connecting part; the frame body (120) surrounds the edge of a mobile terminal (20); an opening (122) used for insertion of a plug (240) of a battery case (200) is formed on the frame body (120) and corresponds to a charging port of the mobile terminal (20). The first snap-in part (140) is fixedly connected on one side of the frame body (120) and is used for snapping the front surface of the mobile terminal (20). The second snap-in part is fixedly connected on the other side of the frame body (120) and is used for snapping the back surface of the mobile terminal (20). The connecting part is fixedly connected with the second snap-in part and can be detachably connected with the battery case (200).

7 Claims, 4 Drawing Sheets

(51) Int. Cl.
  *H04M 1/21* (2006.01)
  *H05K 5/00* (2006.01)
  *H05K 5/02* (2006.01)
  *H04M 1/72409* (2021.01)

(52) U.S. Cl.
  CPC ...... *H04M 1/72409* (2021.01); *H05K 5/0086* (2013.01); *H05K 5/0217* (2013.01)

(58) Field of Classification Search
  CPC ...... H04M 1/21; H04M 1/0262; H04M 1/185; H05K 5/0086; H05K 5/0217; Y02E 60/10; H04B 1/3888; H02J 7/0045
  See application file for complete search history.

(56) References Cited

U.S. PATENT DOCUMENTS

| | | | |
|---|---|---|---|
| 8,891,800 | B1 | 11/2014 | Shaffer |
| 2001/0036764 | A1* | 11/2001 | Funatsu ............. H01R 13/2428 439/341 |
| 2003/0085285 | A1* | 5/2003 | Luu ..................... G06K 7/0034 235/486 |
| 2008/0096521 | A1* | 4/2008 | Boling .................. G08B 15/00 455/404.2 |
| 2014/0370739 | A1* | 12/2014 | Lee ....................... G06F 1/1635 439/366 |
| 2015/0116926 | A1* | 4/2015 | Robinson ............. G06F 1/1632 361/679.43 |
| 2015/0180527 | A1* | 6/2015 | Fathollahi ............ H04B 1/3888 455/575.8 |
| 2016/0142093 | A1* | 5/2016 | Phang .................. H04B 1/3888 455/575.8 |
| 2016/0324442 | A1* | 11/2016 | Zdeblick ............... A61B 5/0537 |
| 2017/0026498 | A1 | 1/2017 | Goldfain et al. |
| 2017/0181299 | A1* | 6/2017 | Shi ...................... H04M 1/0262 |
| 2018/0262826 | A1* | 9/2018 | Ingram ................ H04B 1/3888 |
| 2019/0053613 | A1* | 2/2019 | Forutanpour ............. A45F 5/10 |
| 2020/0274573 | A1* | 8/2020 | Marcum ................ H04B 1/3888 |

FOREIGN PATENT DOCUMENTS

| | | | |
|---|---|---|---|
| CN | 204272196 | U * | 4/2015 |
| CN | 204291082 | U * | 4/2015 |
| CN | 204376978 | | 6/2015 |
| CN | 204376978 | U * | 6/2015 |
| CN | 204615875 | U * | 9/2015 |
| CN | 205160162 | | 4/2016 |
| CN | 205901864 | | 1/2017 |
| JP | 3170660 | | 9/2011 |
| JP | 3181870 | | 2/2013 |
| WO | 2015126572 | | 6/2015 |
| WO | 2015126611 | | 6/2015 |

OTHER PUBLICATIONS

Wang Xuekai, CN-204272196 Translation, Apr. 2015 (Year: 2015).*
Song Fubiao, CN-204291082 Translation, Apr. 2015 (Year: 2015).*
Zheng Min, CN-204615875 Translation, Sep. 2015 (Year: 2015).*

* cited by examiner

MOBILE TERMINAL PROTECTION ASSEMBLY, MOBILE TERMINAL PROTECTION FRAME, AND BATTERY CASE

TECHNICAL FIELD

The present disclosure relates to the technical field of communication equipment, and in particular to a mobile terminal protective assembly and a protective frame and a battery case thereof.

BACKGROUND

With the continuous development of mobile phones and increasingly functions of mobile phones, people are increasingly dependent on mobile phones. Due to a limited electrical capacity of a mobile phone battery, it is often unable to meet the needs of users.

The conventional mobile phone protective cover can only protect the mobile phone, and does not have additional functions such as charging. The battery case is a mobile power source that can be used as a protective cover of mobile phones, but the conventional battery case is heavy and inconvenient to use.

SUMMARY

Accordingly, it is necessary to provide a convenient mobile terminal protective assembly and a protective frame and a battery case thereof.

A mobile terminal protective frame is used for protecting a mobile terminal and mounting a battery case, the protective frame includes:

a frame body surrounding an edge of the mobile terminal, the frame body having an opening for a plug of the battery case to plug in, the opening corresponding to a charging interface of the mobile terminal;

a first snap-in portion fixedly connected to one side of the frame body, the first snap-in portion being configured to engage a front surface of the mobile terminal;

a second snap-in portion fixedly connected to the other side of the frame body, the second snap-in portion being configured to engage a rear surface of the mobile terminal; and a connection portion fixedly connected to the second snap-in portion and detachably connected to the battery case.

A battery case mounted on the protective frame to charge a mobile terminal, the battery case includes:

a battery body storing electrical energy;

a housing wrapped around the battery body;

a plug electrically coupled to the battery body, the plug being located outside the housing and connected to the housing; and a mounting portion fixedly connected to the housing, the mounting portion being detachably connected to the connection portion of the protective frame.

A mobile terminal protective assembly is used for protecting a mobile terminal and charging the mobile terminal, the mobile terminal protective assembly includes:

the protective frame; and the battery case, the mounting portion being detachably connected to the connection portion.

In the above mentioned mobile terminal protective assembly and the protective frame and the battery case thereof, the frame body surrounds the edge of the mobile terminal, so as to protect the mobile terminal during collision or fall. The first snap-in portion and the second snap-in portion are located on the front and rear sides of the mobile terminal, respectively, such that the mobile terminal is snapped in the frame body. When the mobile terminal needs to be charged, the battery case can be mounted on the connection portion. The plug of the battery case is plugged in the charging interface of the mobile terminal, thereby charging the mobile terminal After the charging is completed, the battery case can be removed from the protective frame to reduce the weight, while the protective frame is still sleeved on the mobile terminal, so that the mobile terminal can be continuously protected, and it is convenient to use.

BRIEF DESCRIPTION OF THE DRAWINGS

In order to more clearly illustrate embodiments of the present disclosures or solutions in the prior art, the drawings required to be used in the description of the embodiments or the prior art will be briefly described below. Apparently, the drawings in the following description are merely some embodiments of the present disclosure, and for those of ordinary skill in the art, the drawings of other embodiments can also be obtained from these drawings without any creative effort.

DETAILED DESCRIPTION OF THE EMBODIMENTS

Figure 1:
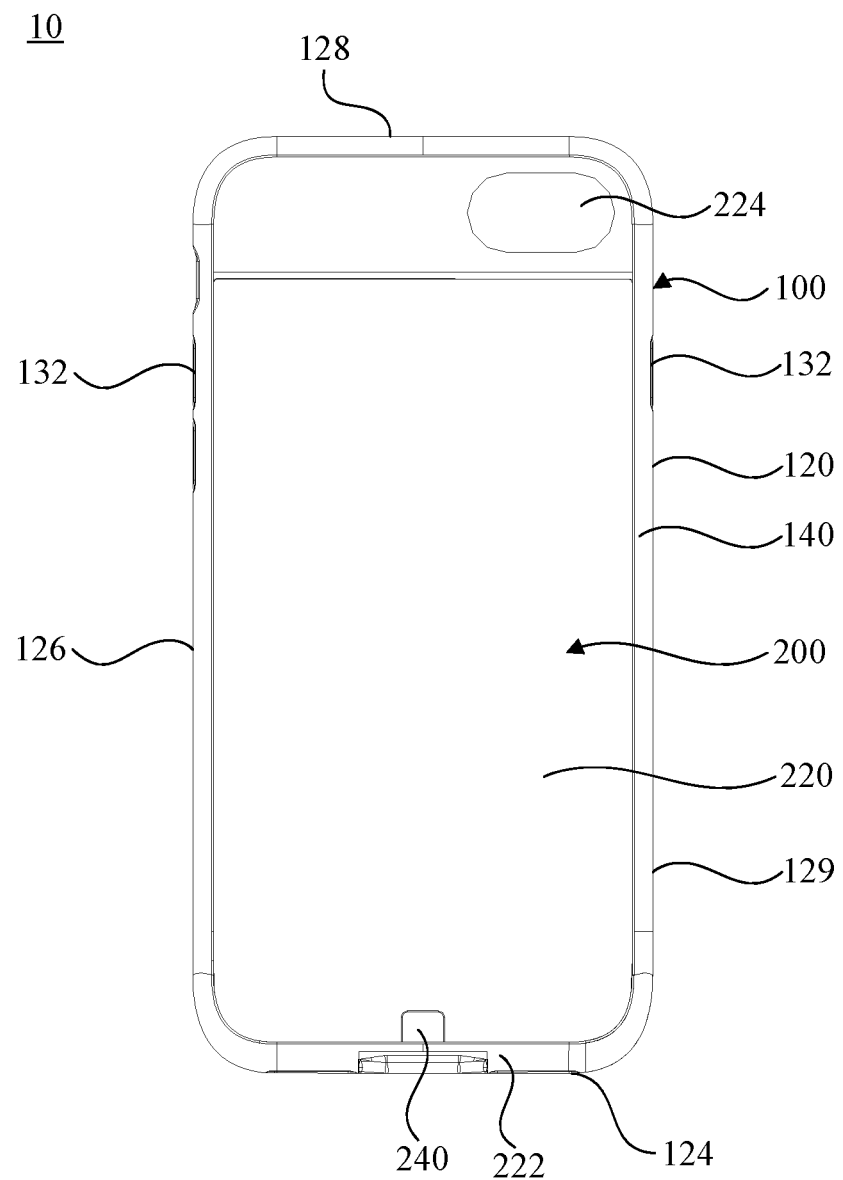
FIG. 1 is a front view of a mobile terminal protective assembly of an embodiment.

In order to facilitate understanding of the present disclosure, a mobile terminal peripheral assembly and a mobile terminal protective frame and a battery case will be described more fully below with reference to the corresponding drawings. Preferred embodiments of the mobile terminal protective assembly and the mobile terminal protective frame and the battery case are shown in the drawings. However, the mobile terminal protective assembly and the mobile terminal protective frame and the battery case can be implemented in many different forms and are not limited to the embodiments described herein. On the contrary, the purpose of providing these embodiments is to make the disclosure contents of the mobile terminal protective assembly and the mobile terminal protective frame and the battery case more thorough and comprehensive.

Unless otherwise defined, all technical and scientific terms used herein have the same meaning as generally understood by those skilled in the art of the present disclosure. The terms used herein in the specification of the mobile terminal protective assembly and the mobile terminal protective frame and the battery case are for the purpose of describing specific embodiments and are not intended to limit the disclosure. As used herein, the term "and/or" includes any and all combinations of one or more related listed items.

Figure 2:
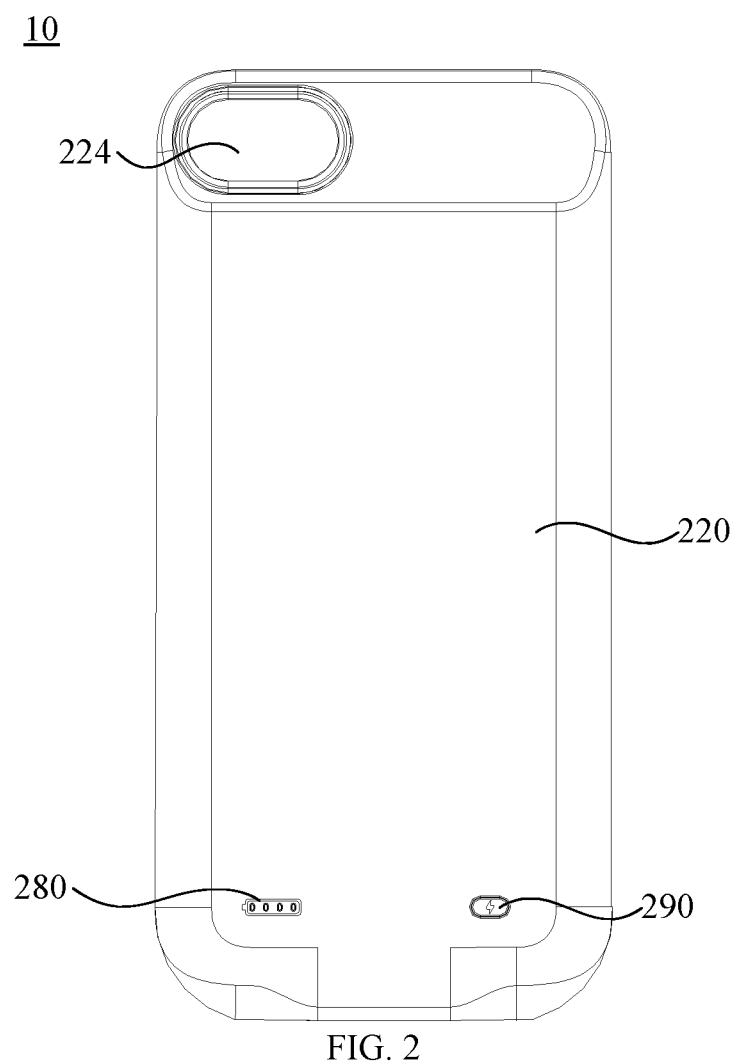
FIG. 2 is a rear view of the mobile terminal protective assembly of FIG. 1.
Figure 3:
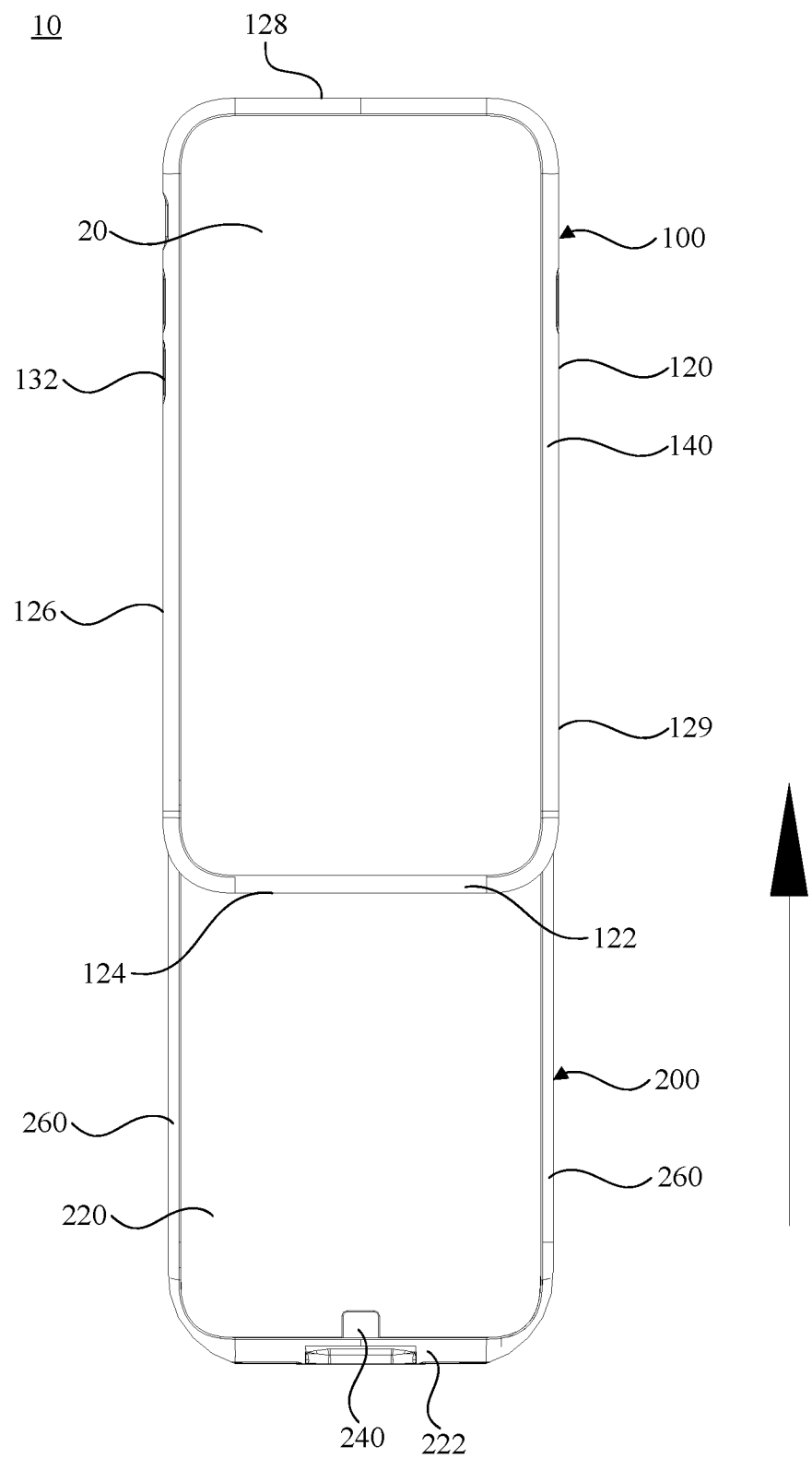
FIG. 3 is a front view of the mobile terminal protective assembly of FIG. 1 in a use state.

Referring to FIG. 1 and FIG. 2, a mobile terminal protective assembly 10 in one embodiment includes a mobile terminal protective frame 100 and a battery case 200. Referring also to FIG. 3, the mobile terminal protective assembly 10 is used for protecting and charging a mobile terminal 20. The mobile terminal 20 can be a mobile communication device, such as a mobile phone or a tablet computer. In the illustrated embodiment, the mobile terminal 20 is the mobile phone.

Specifically, the mobile terminal protective frame 100 is used for protecting the mobile terminal 20 and mounting the battery case 200. The protective frame includes a frame body 120, a first snap-in portion 140, a second snap-in portion, and a connection portion. The frame body 120 can surround an edge of the mobile terminal 20, and the frame body 120 has an opening 122 for a plug 240 of the battery case 200 to plug in, and the opening 122 corresponds to a charging interface of the mobile terminal 20. The first snap-in portion 140 is fixedly connected to one side of the frame body 120, and the first snap-in portion 140 is configured to engage a front surface of the mobile terminal 20. The second snap-in portion is fixedly connected to the other side of the frame body 120, and the second snap-in portion is configured to engage a rear surface of the mobile terminal 20. The connection portion is fixedly connected to the second snap-in portion and detachably connected to the battery case 200.

The battery case 200 is used to be mounted on the protective frame 100 to charge the mobile terminal 20. The battery case 200 includes a battery body, a housing 220, a plug 240, and a mounting portion 260. The battery body is used for storing electrical energy. The housing 220 is wrapped around the battery body. An internal circuit of the plug 240 is electrically coupled to the battery body. The plug 240 is located outside the housing 220 and is connected to the housing 220. The mounting portion 260 is fixedly connected to the housing 220, and the mounting portion 260 can be detachably connected to the connection portion of the protective frame 100.

The frame body 120 surrounds the edge of the mobile terminal 20, so as to protect the mobile terminal 20 during collision or fall. The first snap-in portion 140 and the second snap-in portion are located on the front and rear sides of the mobile terminal 20, respectively, such that the mobile terminal 20 is snapped in the frame body 120. When the mobile terminal 20 needs to be charged, the battery case 200 can be mounted on the connection portion. The plug 240 of the battery case 200 is plugged in the charging interface of the mobile terminal 20, thereby charging the mobile terminal 20. After the charging is completed, the battery case 200 can be removed from the protective frame 100, to reduce the weight. While the protective frame 100 is still sleeved on the mobile terminal 20, so that the mobile terminal 20 can be continuously protected, and it is convenient to use.

In one of the embodiments, the connection portion is provided with a snap-in groove having an extending direction which is consistent with an extending direction of a long side of the mobile terminal 20. The mounting portion 260 is provided with a convex rib having an extending direction which is consistent with an extending direction of a long side of the mobile terminal 20. A shape of a cross-section of the convex rib corresponds to a shape of a cross-section of the snap-in groove, the convex rib can be inserted into the snap-in groove from one end of the snap-in groove, thus the mounting portion 260 is connected to the connection portion. The arrow in FIG. 3 indicates the mounting direction when the battery case 200 is mounted on the protective frame 100. The cooperation of the convex rib and the snap-in groove allows the mounting portion 260 to be quickly and stably connected to the connection portion. Meanwhile, the structures of the convex rib and the snap-in groove are simple and easy to process.

Figure 4:
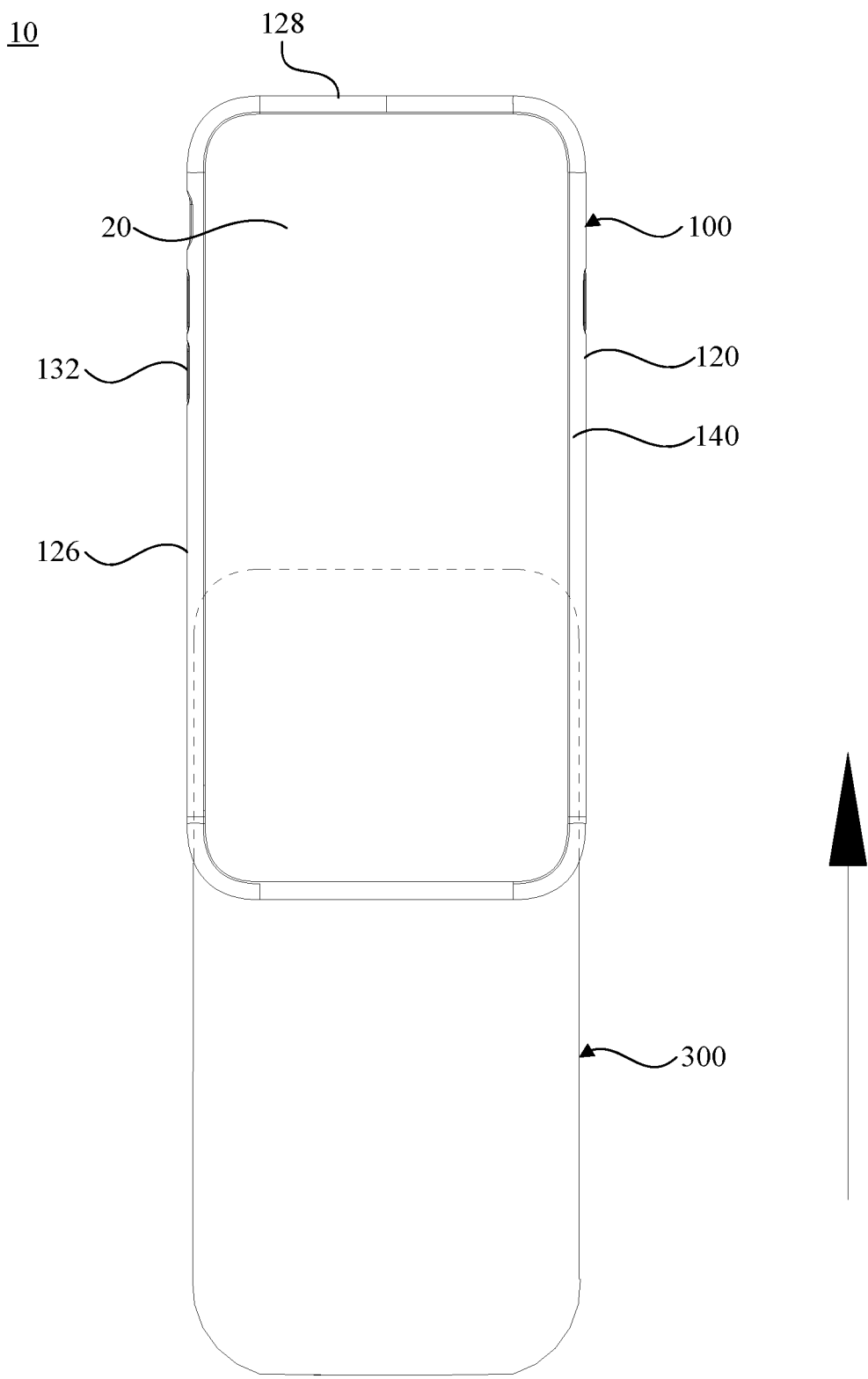
FIG. 4 is a front view of the mobile terminal protective assembly of FIG. 1 in another use state.

Referring also to FIG. 4, after the battery case 200 is removed from the protective frame 100, a protective housing 300 can be mounted on the protective frame 100. The protective housing 300 has the same or similar connection structure as the mounting portion 260, thereby achieving a detachable connection to the connection portion. The arrow in FIG. 4 indicates a mounting direction when the protective frame 300 is mounted on the protective frame 100. The configuration of the protective frame 300 can further protect the mobile terminal 20. Meantime, the protective frame 300 can be provided with more abundant functional components, such as a clasp, a finger ring buckle and the like, which is more convenient for use.

Further, in one embodiment, two connection portions and two mounting portions 260 are provided. The two connection portions are located adjacent to two long sides of the mobile terminal 20, respectively, the two mounting portions 260 and the two connection portions are in one-to-one correspondence. Two connection portions and two mounting portions 260 make the connection more reliable.

The protective frame 100 can have an integral injection molding structure, and can be made of plastic, silica gel, or the like. The above-described protective frame 100 is low in cost and has a certain deformation capability to facilitate mounting on the mobile terminal 20. The protective frame 100 can also be made of a metal material such as an aluminum alloy, which has a better mechanical strength and a better protection effect to the mobile terminal 20. The protective frame 100 of a rigid material facilitates a detachable connection to the battery case 200.

Referring again to FIGS. 1 and 3, in one of the embodiments, the first snap-in portion 140 and the second snap-in portion are both annular in shape and protrude inward from the frame body 120. The frame body 120 includes a first frame bar 124, a second frame bar 126, a third frame bar 128, and a fourth frame bar 129 which are connected end to end. The first frame bar 124 is opposite to the third frame bar 128. The second frame bar 126 is opposite to the fourth frame bar 129.

Further, in one embodiment, the opening 122 can be located on the first frame bar 124, and the second frame bar 126 and the fourth frame bar 129 are each provided with a pressing key 132 corresponding to a function key of the mobile terminal 20. In other embodiments, the pressing key 132 can be provided only on the second frame bar 126 or the fourth frame bar 129 depending on the positions of the function keys of the different mobile terminals 20.

Referring again to FIG. 3, in one of the embodiments, the housing 220 is provided with an engaging projection 222 at an edge thereof. The engaging projection 222 is shaped to correspond to the opening 122. The engaging projection 222 is embedded in the opening 122 and abuts against the mobile terminal 20. The plug 240 is connected to the housing 220 through the engaging projection 222, and the plug 240 is located at a side of the engaging projection 222 abutting against the mobile terminal 20. The cooperation of the engaging projection 222 and the opening 122 allows the plug 240 to be more reliably connected to the charging interface of the mobile terminal 20.

Referring to FIG. 2, in one embodiment, a camera hole 224 can be provided on the housing 220 of the battery case 200 to avoid shielding a camera of the mobile terminal 20. If the mobile terminal 20 is provided with a flash, the position where the camera hole 224 is located can also cover the position of the flash.

In one embodiment, the battery case 200 can further include an indicator light 280 located at a side of the housing away from the mobile terminal 20, the indicator light 280 is communicated with the battery body. The indicator light 280 can be used to indicate the operating status and remaining power of the battery body. In one embodiment, the battery case 200 can further include a charging connector 290, which can be located on the side of the housing away from the mobile terminal 20 and is electrically coupled to the battery body.

The various technical features of the above-described embodiments can be arbitrarily combined, and for the sake of brevity, all possible combinations of the various technical features in the above-described embodiments are not described. However, as long as there is no contradiction in the combination of these technical features, it should be deemed to be within the scope of this specification.

The above-described embodiments represent only several embodiments of the disclosure. The description of the embodiments is more specific and detailed, but are not therefore to be construed as limiting the scope of the disclosure patent. It should be noted that several modifications and improvements can be made to those of ordinary skill in the art without departing from the inventive concept, all of the modifications and improvements fall within the scope of the disclosure. Therefore, the scope of protection of the disclosure patent shall be subject to the appended claims.

What is claimed is:

1. A mobile terminal protective assembly for protecting a mobile terminal and charging the mobile terminal, the mobile terminal protective assembly comprising:
   a protective frame for protecting a mobile terminal and mounting a battery case, the protective frame comprising:
      a frame body surrounding an edge of the mobile terminal, the frame body having an opening in a bottom edge thereof, for a plug of the battery case to plug in, the opening corresponding to a charging interface of the mobile terminal;
      a first snap-in portion fixedly connected to one side of the frame body, the first snap-in portion being configured to engage a front surface of the mobile terminal;
      a second snap-in portion fixedly connected to the other side of the frame body, the second snap-in portion being configured to engage a rear surface of the mobile terminal; and
      a connection portion fixedly connected to the second snap-in portion and detachably connected to the battery case; and
   the battery case mounted on the protective frame to charge a mobile terminal, the battery case comprising:
      a battery body storing electrical energy;
      a housing wrapped around the battery body;
      a plug electrically coupled to the battery body, the plug being located outside the housing and connected to the housing; and
      a mounting portion fixedly connected to the housing, the mounting portion being detachably connected to the connection portion of the protective frame;
   wherein the housing is integrally provided with an engaging projection at a bottom edge thereof, the engaging projection being shaped to correspond to the opening in the bottom edge of the frame body, the engaging projection being totally embedded in the opening and abutting against the mobile terminal; and
   the plug being connected to the housing through the engaging projection, and the plug being located at a side of the engaging projection abutting against the mobile terminal.

2. The mobile terminal protective assembly of claim 1, wherein the connection portion is provided with a snap-in groove having an extending direction being consistent with an extending direction of a long side of the mobile terminal;
   the mounting portion being provided with a convex rib having an extending direction being consistent with an extending direction of a long side of the mobile terminal, a shape of a cross-section of the convex rib corresponding to a shape of a cross-section of the snap-in groove, the convex rib being capable of being inserted into the snap-in groove from one end of the snap-in groove, thus the mounting portion being connected to the connection portion.

3. The mobile terminal protective assembly of claim 1, wherein two connection portions and two mounting portions are provided, the two connection portions being located adjacent to two long sides of the mobile terminal, respectively, the two mounting portions and the two connection portions being in one-to-one correspondence.

4. The mobile terminal protective assembly of claim 1, wherein the first snap-in portion and the second snap-in portion are both annular in shape and protrude inward from the frame body; and
   the frame body comprises a first frame bar, a second frame bar, a third frame bar, and a fourth frame bar which being connected end to end, the first frame bar being opposite to the third frame bar, the second frame bar being opposite to the fourth frame bar.

5. The mobile terminal protective assembly of claim 1, wherein the opening is located on the first frame bar, the second frame bar and/or the fourth frame bar are provided with a pressing key corresponding to a function key of the mobile terminal.

6. The mobile terminal protective assembly of claim 1, wherein the protective frame is an integral injection molding structure.

7. The mobile terminal protective assembly of claim 1, wherein the battery case further comprises an indicator lamp on a side of the housing away from the mobile terminal, the indicator lamp being communicated with the battery body.

* * * * *